United States Patent
Joshi et al.

(10) Patent No.: US 8,854,067 B2
(45) Date of Patent: Oct. 7, 2014

(54) CIRCULAR TRANSMISSION LINE METHODS COMPATIBLE WITH COMBINATORIAL PROCESSING OF SEMICONDUCTORS

(75) Inventors: Amol Joshi, Sunnyvale, CA (US); Charlene Chen, San Jose, CA (US); John Foster, Mountain View, CA (US); Zhendong Hong, San Jose, CA (US); Olov Karlsson, San Jose, CA (US); Bei Li, Fremont, CA (US); Dipankar Pramanik, Saratoga, CA (US); Usha Raghuram, Saratoga, CA (US); Mark Victor Raymond, Schenectady, NY (US); Jingang Su, Cupertino, CA (US); Bin Yang, San Carlos, CA (US)

(73) Assignees: Intermolecular, Inc., San Jose, CA (US); GLOBALFOUNDRIES, Inc., Grand Cayman (KY)

( * ) Notice: Subject to any disclaimer, the term of this patent is extended or adjusted under 35 U.S.C. 154(b) by 272 days.

(21) Appl. No.: 13/594,292

(22) Filed: Aug. 24, 2012

(65) Prior Publication Data
US 2014/0055152 A1 Feb. 27, 2014

(51) Int. Cl.
*G01R 27/08* (2006.01)
*G01R 31/28* (2006.01)

(52) U.S. Cl.
CPC ............ *G01R 27/08* (2013.01); *G01R 31/2831* (2013.01)
USPC .......................................... 324/720; 324/691

(58) Field of Classification Search
CPC .... G01R 27/08; G01R 31/2831; H01L 22/14; H01L 22/20; D02J 13/00
USPC ....... 324/691, 720; 118/723 R; 427/446, 569; 438/114
See application file for complete search history.

(56) References Cited

U.S. PATENT DOCUMENTS

| 6,708,321 | B2 * | 3/2004 | Wheeler et al. ............... 716/101 |
| 6,830,663 | B2 * | 12/2004 | Wang et al. ................ 204/192.1 |
| 6,949,267 | B2 * | 9/2005 | Moini et al. ...................... 427/8 |
| 2007/0082508 | A1 * | 4/2007 | Chiang et al. ................. 438/800 |

OTHER PUBLICATIONS

Stavitski, N. et al.; Evaluation of Transmission Line Model Structures for SilicidetoSilicon Specific Contact Resistance Extraction; May 1, 2008; IEEE Transactions on Electron Devices vol. 55 No. 5 pp. 11701176.

Hewett, C.A., et al.; Specific Contact Resistance Measurements of Ohmic Contacts to Semiconducting Diamond; Jan. 15, 1995; American Institute of Physics; J. Appl. Phys. pp. 755760.

Deepak, et al.; Measurement of Small Specific Contact Resistance of Metals with Resistive Semiconductors; Jan. 1, 2007; Journal of Electronic Materials vol. 36 No. 5 pp. 598605.

Berger, H.H.; Models for Contacts to Planar Devices; Jan. 1, 1972; Z—Book—Pergamon Press; SolidState Electronics vol. 15 pp. 145158.

(Continued)

*Primary Examiner* — Jermele M Hollington
*Assistant Examiner* — Raul Rios Russo

(57) ABSTRACT

Methods and structures are described for determining contact resistivities and Schottky barrier heights for conductors deposited on semiconductor wafers that can be combined with combinatorial processing, allowing thereby numerous processing conditions and materials to be tested concurrently. Methods for using multi-ring as well as single-ring CTLM structures to cancel parasitic resistance are also described, as well as structures and processes for inline monitoring of properties.

12 Claims, 18 Drawing Sheets

(56) References Cited

OTHER PUBLICATIONS

Murrmann, H., et al.; Current Crowding on Metal Contacts to Planar Devices; Dec. 1, 1969; Z—Not Available; IEE Transactions o n Electron Devices vol. ED16 pp. 10221024.

Green, M.L., et al.; Application of combinatorial methodologies for work function engineering of metal gatehigh advanced gate stacks; Jan. 1, 2007; Z—Book—Elsevier; Microelectronic Engineering pp. 22092212.

* cited by examiner

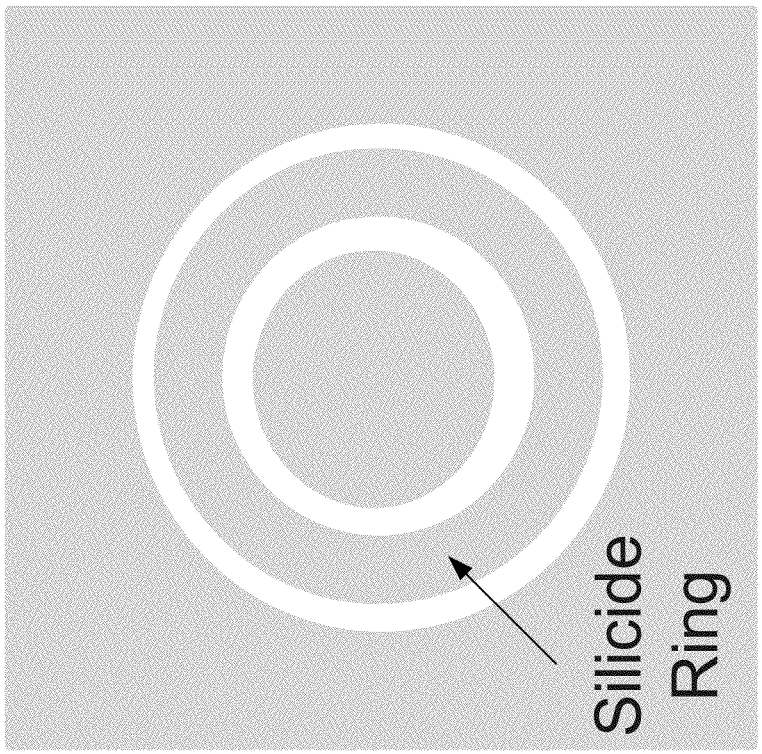
(B)
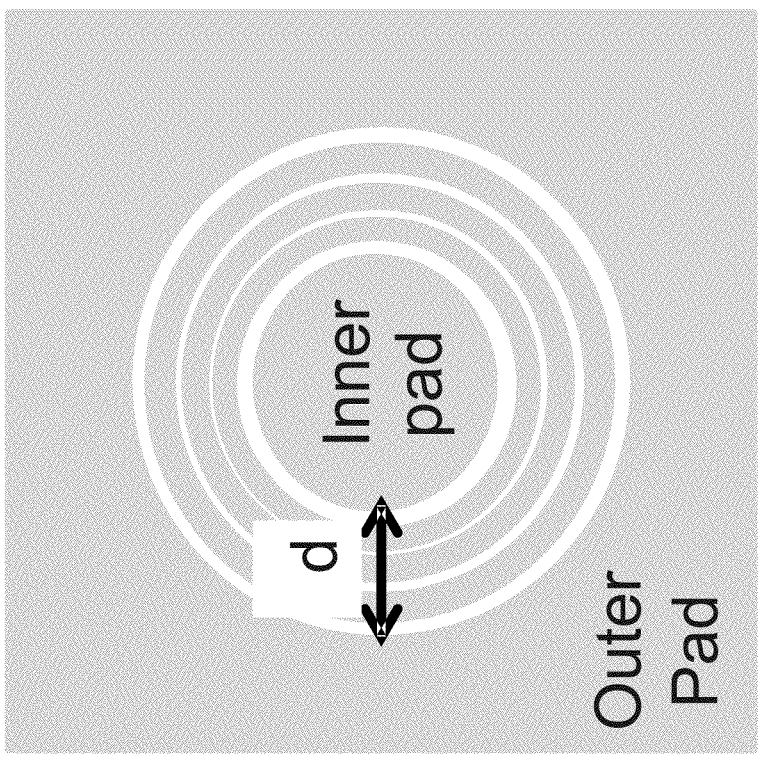
(A)
FIG. 15

If both $r_i$ and $r_o \gg 4L_T$:

$$R_T = \frac{R_S}{2\pi}\left[\ln\left(\frac{r_o}{r_i}\right) + L_T\left(\frac{1}{r_o} + \frac{1}{r_i}\right)\right]$$

$$L_T = \sqrt{(\rho_C/R_S)}$$

$R_T$ : total resistance $R_S$ : semiconductor sheet resistance $R_C$ : contact resistance $\rho_C$ : specific contact resistivity If $r_o \gg d \Rightarrow R_T \cong R_S\left(\dfrac{d + 2L_T}{2\pi r_o}\right)$ plot $R_T$ as a function of $d$:

slope $\Rightarrow R_S$ intercept $\Rightarrow L_T \Rightarrow R_C$

FIG. 17

CIRCULAR TRANSMISSION LINE METHODS COMPATIBLE WITH COMBINATORIAL PROCESSING OF SEMICONDUCTORS

BACKGROUND OF THE INVENTION

This invention relates generally to the field of semiconductor device manufacturing, more particularly to combinatorial processing of semiconductors with the determination of electrical properties of such devices, and most particularly to determining contact resistance and Schottky barrier height in a manner compatible with combinatorial processing.

Semiconductor electronic devices are found in virtually every segment of the modern economy. Continual efforts are made to improve such devices, to develop new, better and cheaper devices, to improve the materials used in such devices and to improve manufacturing processes. There is an on-going need in the art for improvements in all aspects related to semiconductor device design, manufacturing and use.

A typical semiconductor device includes numerous different materials, interfaces between materials and subsystems whose electrical, thermal, chemical and mechanical properties affect the overall performance of the device. Different semiconductor materials with different dopants and doping levels are typically present, along with various conductors and insulators, all in various geometric configurations with numerous interfacial regions where such materials come into contact, may blend to form alloys or distinct compounds. Additional complexity can arise from effects of processing. For example heat treatments of a metal-silicon interface can lead to the formation of silicides. Analogous changes may occur when other interfaces are subjected to thermal or other processing steps. Thus, in designing such devices, or striving to improve the materials and/or manufacturing processes, it is important to know the properties of such materials and interfaces and how such properties are expected to change in response to contemplated changes in materials, geometry and/or processing.

Techniques for conducting dozens or even hundreds of experiments in parallel have been developed, and continue to be developed, under the general label "combinatorial processing." These techniques obviously speed up R&D by a tremendous factor, allowing numerous tests to be conducted, and data collected, concurrently. One recent discussion of combinatorial techniques applied to materials science can be found in "Combinatorial Materials Science" by B. Narasimhan et al (eds)., Wiley-Interscience (2007). In particular, various materials, geometries and processing conditions for the manufacture of semiconductor devices can be tested in parallel, exemplified by the specific applications of combinatorial processing to semiconductor devices by Intermolecular, Inc. of San Jose, Calif., employing their High-Productivity Combinatorial™ (HPC™) technology and various devices and procedures related thereto. Such technologies also are known as high-throughput combinatorial technology or combinatorial technology. For economy of language we refer generally to such combinatorial techniques as HPC.

The semiconductor device industry continually has the challenge of developing techniques for determining properties of candidate materials, interfaces and/or structures for semiconductor devices that can be effectively used in combination with HPC processing. Thus, a need exists in the art for improved techniques of determining properties related to semiconductor device performance that are compatible with HPC processing.

SUMMARY OF THE INVENTION

Accordingly and advantageously the present invention relates to the determination with combinatorial techniques, of various properties arising in the fabrication of semiconductors. Methods for determining contact resistivities and Schottky barrier heights consistent with combinatorial processing techniques are described, thereby providing for a dramatic increase in the data that can be obtained, leading to much more rapid improvements to semiconductor fabrication materials, structures and processes.

These and other features and advantages of the present invention will be understood upon consideration of the following detailed description of the invention and the accompanying drawings.

BRIEF DESCRIPTION OF THE DRAWINGS

To facilitate understanding, identical reference numerals have been used, where possible, to designate identical elements that are common to the figures. The drawings herein are schematic, not to scale and the relative dimensions of various elements in the drawings are not to scale.

The techniques of the present invention can readily be understood by considering the following detailed description in conjunction with the accompanying drawings, in which:

FIG. 15 is a top schematic view of a typical multi-ring CTLM (A), along with a reference CTLM (B), that can be used to cancel parasitic resistances from measurements of contact resistance.

FIG. 17 presents methods for determining the contact resistance for single ring CTLM structure.

DETAILED DESCRIPTION

After considering the following description, those skilled in the art will clearly realize that the teachings of the invention can be readily used for determining properties related to semiconductor device performance in a manner compatible with HPC processing. In particular, techniques are described for the measurement of contact resistivity at interfaces typically occurring in semiconductor devices, Schottky barrier heights, and in some embodiments, concurrent inline measurement of other properties.

"Combinatorial Processing" generally refers to techniques of differentially processing multiple regions of one or more substrates. Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.).

Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether particular processes and/or materials are suitable for production or high volume manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all incorporated herein by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all incorporated herein by reference.

Figure 1:
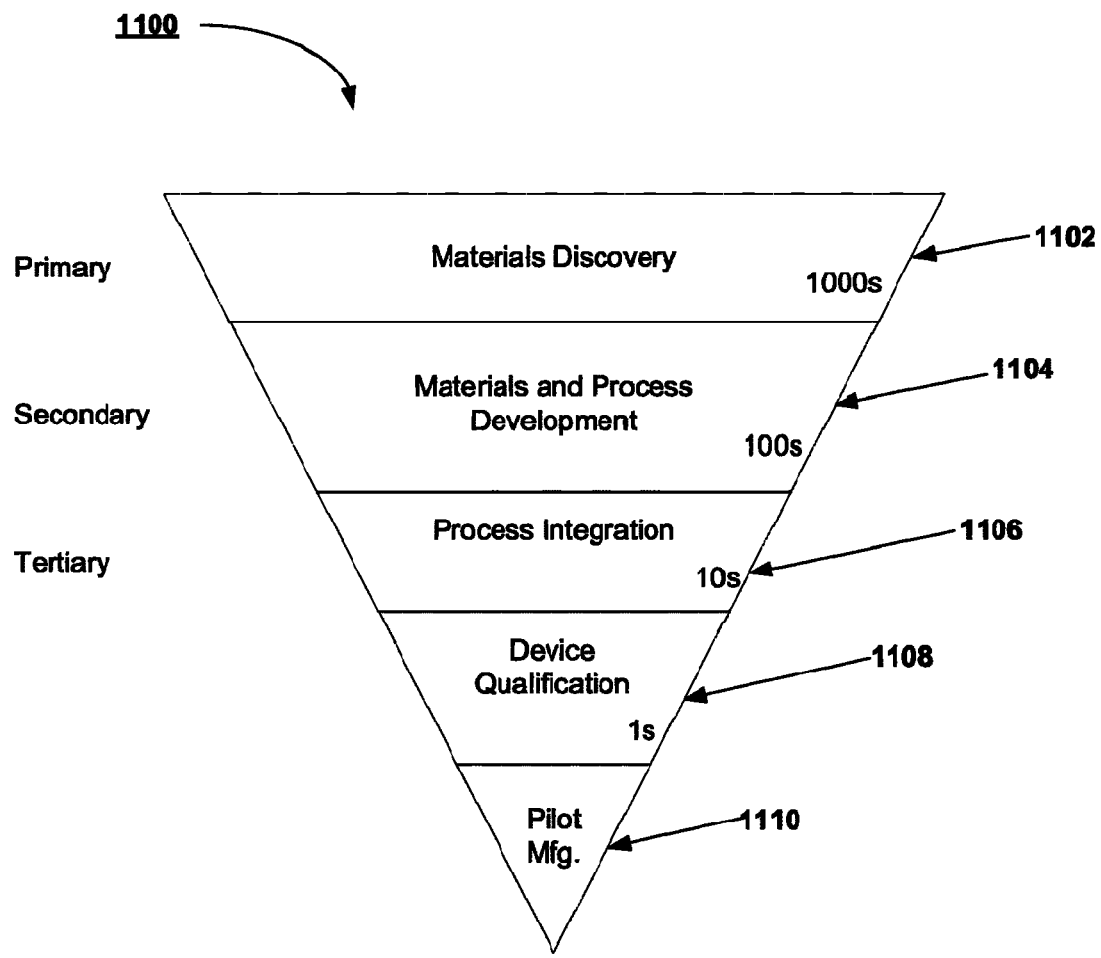
FIG. 1 illustrates a schematic diagram for implementing combinatorial processing and evaluation using primary, secondary and tertiary screening.

FIG. 1 illustrates a typical schematic diagram for implementing combinatorial processing and evaluation using primary, secondary, and tertiary screening. The schematic diagram, 1100, illustrates that the relative number of combinatorial processes run with a group of substrates decreases as certain materials and/or processes are selected. Generally, combinatorial processing includes performing a large number of processes during a primary screen (perhaps in the thousands), selecting promising candidates from those processes (perhaps in the hundreds), performing the selected processing during a secondary screen, selecting promising candidates from the secondary screen for a tertiary screen, and so on. In addition, information obtained from later stages can be fed back to earlier stages to refine the success criteria and provide better screening results.

For example, thousands of materials are typically evaluated during a materials discovery stage, 1102. Materials discovery stage, 1102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 1104. Evaluation of the materials is typically performed using tools such as electronic testers, imaging tools (i.e., microscopes) among other evaluation procedures and instruments.

The materials and process development stage, 1104, may typically evaluate hundreds of materials (i.e., an order of magnitude smaller than the primary stage) and may focus on the processes used to deposit or develop those materials. Promising materials and processes are again selected, and advanced to the tertiary screen or process integration stage, 1106, where tens of materials and/or processes and combinations are typically evaluated. The tertiary screen or process integration stage, 1106, may focus on integrating the selected processes and materials with other processes and materials.

The most promising materials and processes from the tertiary screen may then be advanced to device qualification, 1108. In device qualification, the materials and processes selected are typically evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 1110.

The schematic diagram, 1100, is an example of various techniques that may be used to evaluate and select materials and processes for the development of advantageous new materials and processes. The descriptions of primary, secondary, etc. screening and the various stages, 1102-1110, are arbitrary and the stages may overlap, occur out of sequence, be described and be performed in many other ways.

The subject matter described herein relates to High Productivity Combinatorial (HPC) techniques described in (for example) U.S. patent application Ser. No. 11/674,137 ("'137") filed on Feb. 12, 2007 which is hereby incorporated herein by reference in its entirety. Some of the embodiments described herein enable the application of combinatorial techniques to evaluate and improve the electronic performance of certain subsystems and components typically occurring in semiconductor devices.

Figure 2:
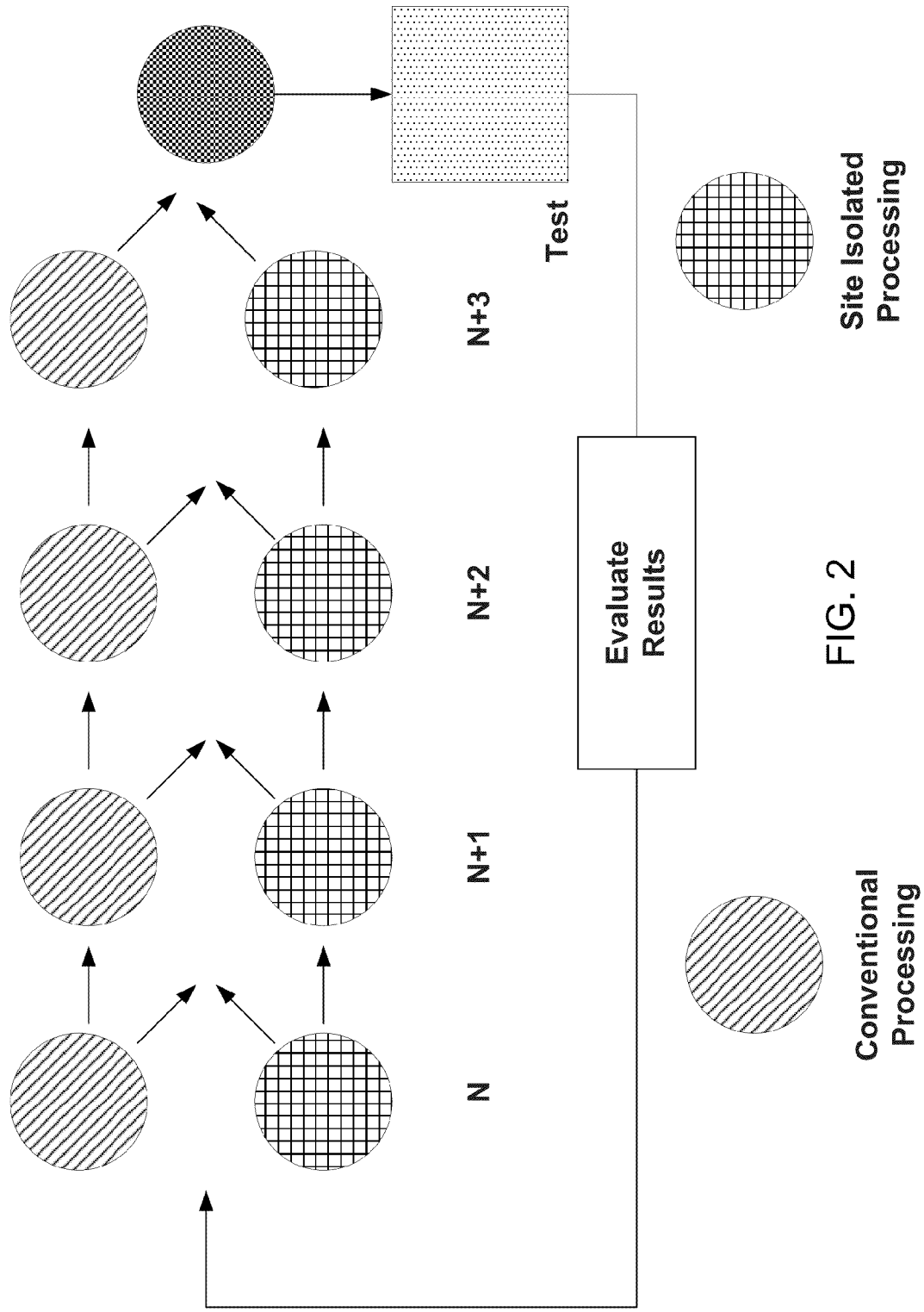
FIG. 2 is a simplified schematic diagram illustrating a general methodology for combinatorial process sequence integration that includes site isolation processing and/or conventional processing in accordance with some embodiments of the invention.

FIG. 2 is a simplified schematic diagram illustrating a general methodology for combinatorial process sequence integration that includes site isolated processing and/or conventional processing in accordance with some embodiments of the invention. In some embodiments, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are typically caused to be substantially uniform, in contrast to gradient processing techniques which rely on the inherent non-uniformity of the material deposition. That is, in general the embodiments described herein locally perform the processing in a conventional manner, e.g., substantially consistent and substantially uniform, while globally over the substrate, the materials, processes, and process sequences may vary. Thus, the testing will find improvements or optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, in general the potential overlap is only allowed with material or processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 3:
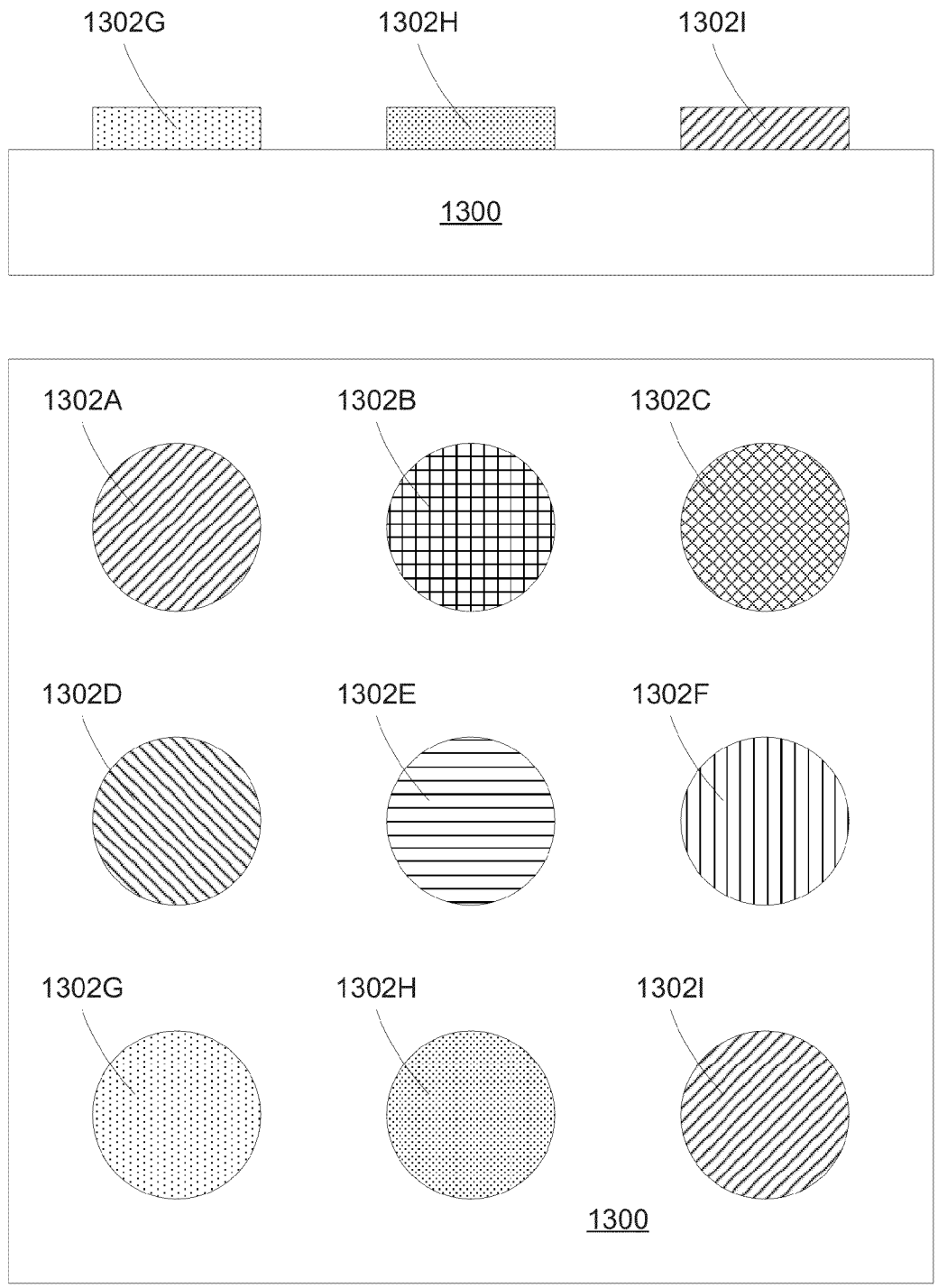
FIG. 3 illustrates a schematic diagram of a substrate that has been processed in a combinatorial manner.

FIG. 3 illustrates a schematic diagram of a substrate that has been processed in a combinatorial manner. A substrate, 1300, is shown with nine site isolated regions, 1302a-1302i, illustrated thereon. Although the substrate 1300 is illustrated as being a generally square shape, those skilled in the art will understand that the substrate may be any useful shape such as round, rectangular, etc. The lower portion of FIG. 3 illustrates a top down view while the upper portion of FIG. 3 illustrates a cross-sectional view taken through the three site isolated regions, 1302g-1302i. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 4:
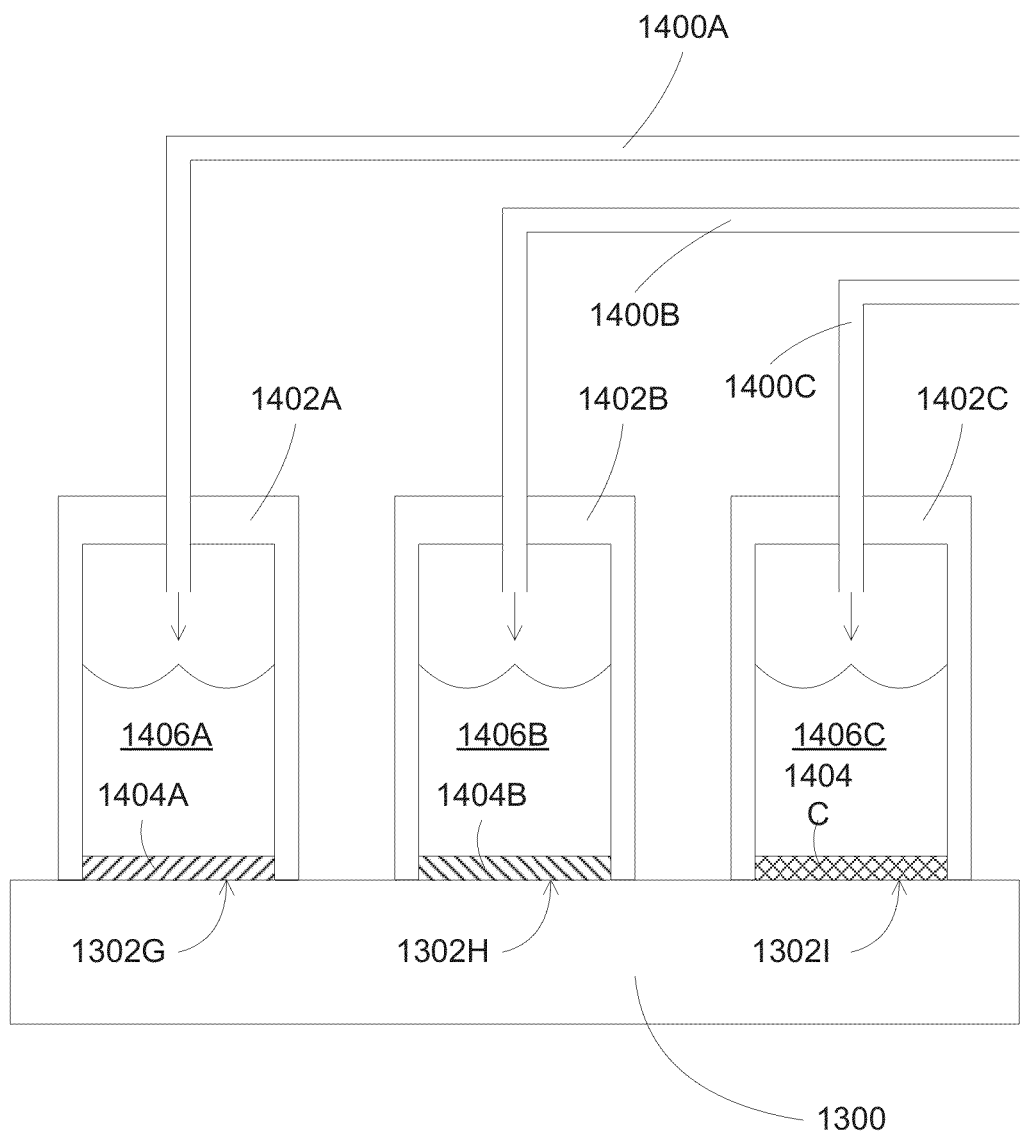
FIG. 4 illustrates a schematic diagram of a combinatorial wet processing system according to some embodiments described herein.

FIG. 4 illustrates a schematic diagram of a combinatorial wet processing system according to some embodiments described herein. A combinatorial wet system may be used to investigate materials deposited by solution-based techniques. Those skilled in the art will realize that this is only one possible configuration of a combinatorial wet system. FIG. 4 illustrates a cross-sectional view of substrate, 1300, taken through the three site isolated regions, 1302g-1302i similar to the upper portion of FIG. 3. Solution dispensing nozzles, 1400a-1400c, supply different solution chemistries, 1406a-1406c, to chemical processing cells, or reactors, 1402a-1402c. FIG. 4 illustrates the deposition of a layer, 1404a-1404c, on respective site isolated regions. Although FIG. 4 illustrates a deposition step, other solution-based processes such as cleaning, etching, surface treatment, surface functionalization, etc. may be investigated in a combinatorial manner. Advantageously, the solution-based treatment can be customized for each of the site isolated regions.

In some embodiments, the present invention discloses systems and methods for generating site isolated regions on a substrate, allowing combinatorial processing without cross contamination between regions. The site isolated regions are sealed against the substrate through a sealing mechanism that can be effective for different substrate surface conditions, including surface layer removal at the sealing interface.

Contact Resistivity: Single Ring CTLM

One important property in determining the performance of a semiconductor device is the contact resistivity arising at the interface between two different materials, typically a conductor and a semiconductor. For example, a transistor fabricated on a semiconductor substrate typically includes a source region and a drain region connected by a channel (source-drain channel) carrying current between the source and the drain controlled by a gate electrode above the channel, typically separated from the channel by a dielectric layer. It is important that current be conducted out of the transistor without significant resistive losses (parasitic resistance) which could result in an overly large voltage drop, loss of driving power, excessive heat generated in the device as well as insufficient current being available elsewhere in the device. This parasitic resistive loss depends on the contact resistance between a metal conductor and the adjacent silicon or silicide substrate. Silicides are typically formed upon heat treatment with a metal in contact with silicon. Silicides tend to be stable during further heat treatment steps and are commonly employed in semiconductor devices. Clearly, knowledge of these contact resistances, derivable from knowledge of contact resistivities, would be important in understanding and improving device performance, perhaps making use of the data as input to sophisticated computer-implemented device models.

Contact resistivities are typically rather small for silicon and silicides. Directly measuring voltage drops (from one side of a silicon slab to the other, for example) presents practical challenges. Other techniques have been investigated and compared, for example, in the work of H. H. Berger, *Solid State Electronics*, 1972, Vol. 15, pp. 145-158, the entire contents of which is incorporated herein by reference. One of these alternative techniques for measuring contact resistivity is the Transmission Line Method (or Model), TLM. The TLM is often carried out in a linear geometry, by measuring the resistivity between two or more parallel strips of conductor deposited on the substrate of interest.

However, this linear implementation of TLM has several disadvantages, including the need for relatively long strips to reduce the effects arising from the ends of the strips. Thus, in many cases an improved approach to TLM makes use of substantially circular structures to perform Circular Transmission Line Methods ("CTLM") for performing contact resistivity measurements having one or more concentric circular structures of metal on the desired semiconductor (or silicide) substrate, for example, as discussed in the work of Hewett et al *J. Appl. Phys.* 77(2), 15 Jan. 1995 pp. 755-760, and Deepak et al, *J. Electronic Materials*, Vol. 36, No. 5 (2007) pp. 598-605. The entire contents of both references are incorporated herein by reference.

One important advantage of CTLM structures over TLM structures is that CTLM structures are self-isolating. That is, the outer conductor of the CTLM can be grounded and the voltage (or voltages) developed at the inner conductor (or conductors) will not interact with neighboring structures. This makes the CTLM structure particularly advantageous for use in combination with HPC processing in which numerous distinct test sites can be employed on a single wafer with minimal electrical interactions between sites.

As noted elsewhere, one challenge in determining accurate values of contact resistivity for Si is its rather small value, testing the accuracy of many procedures for measuring the resulting small voltage differences. Another advantage of CTLMs derives from the fact that the circular geometry of the CTLM results in current conducted through a smaller area, increasing the resistance values (and the voltage differences) making better signals and more accurate data easier to obtain.

Figure 5:
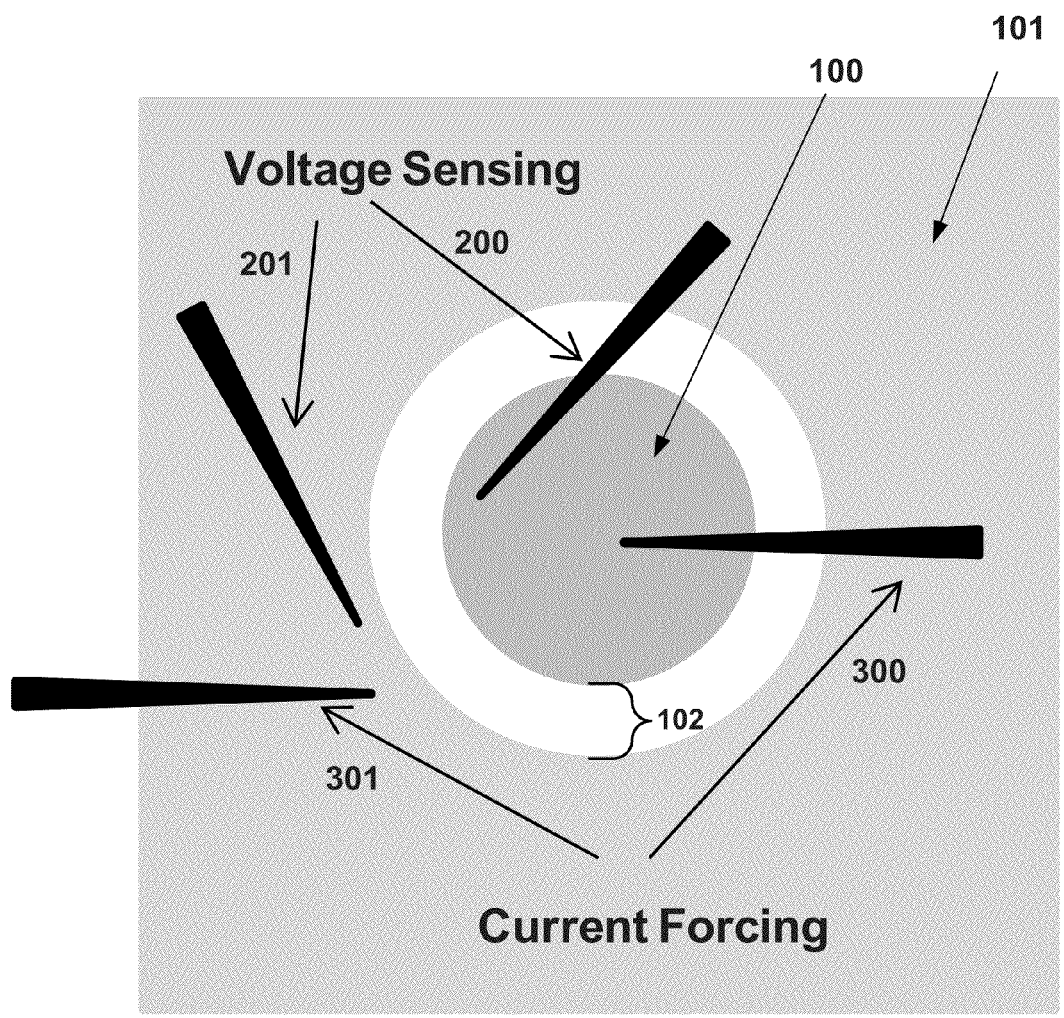
FIG. 5 is a top schematic view of a typical single-ring 4-probe CTLM on a substrate with an inner conducting region 100, an outer conducting region 101 separated by an annular region 102 exposing the underlying substrate, and two current forcing probes 300, 301 and two voltage sensing probes 200, 201.

A typical structure for CTLM is depicted in FIG. 5, which is a top view of inner and outer conductors (100, 101 respectively) separated by a gap, 102, lying on a substrate in the plane of FIG. 5. The gap is typically annular in shape as depicted in FIG. 5, but this is not an inherent limitation. The radius of the inner conductor 100 is typically around 50 μm (micrometer) but this is a matter of convenience and other radii can be employed. The substrate upon which the CTLM lies is typically a semiconductor, such as Si (silicon) Ge (germanium), among others. A 4-probe combination is typically employed as depicted in FIG. 5, two probes for forcing current and two probes for voltage sensing.

The general procedure is to measure the resistance between electrodes 100 and 101 as a function of the gap width (also referred to as gap size or separation) 102. Typically, the voltages to be measured in determining contact resistivity for silicon substrates are quite small, making it advantageous to employ a source of fixed current between the inner current forcing probe 300 and the outer current forcing probe 301, and to perform these measurements for a variety of CTLM structures having differing gap widths 102, computing the total resistance $R_{total}$ for each such CTLM structure from the ratio of the measured (or sensed) voltage $V_{sensing}$ to the forcing current $I_{forcing}$ as in Eq. 1.

$$R_{total} = (V_{sensing})/(I_{forcing}) \qquad \text{Eq. 1}$$

A sequence of constant current values is used and a voltage between electrodes 100 and 101 determined for each current value through voltage sensing probes 200 and 201. The result is substantially a straight line and the slope of this line provides the resistance according to Eq. 1.

Figure 6:
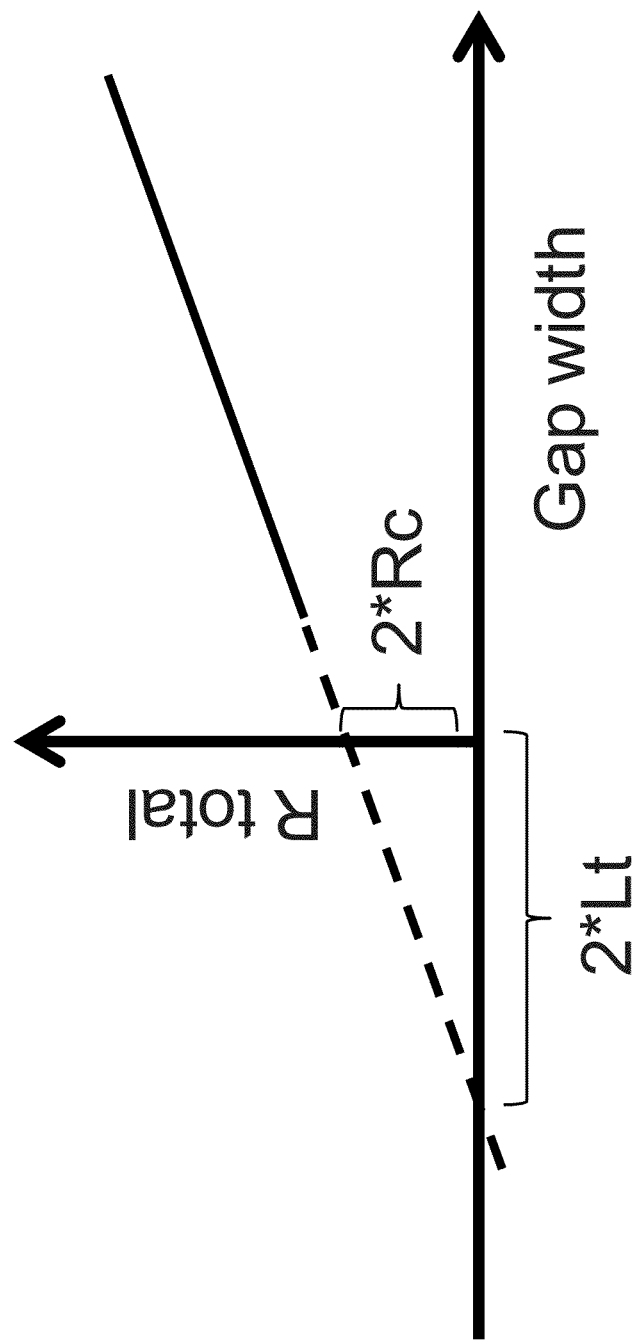
FIG. 6 is a graphical depiction of a typical example of the procedure for obtaining contact resistance $R_c$ (or Rc), from total resistance $R_{total}$ (or R total) as a function of gap width. Transfer length, Lt (or $L_T$) is defined in FIG. 17.

A typical result is given in FIG. 6 in which "Gap width" is the gap width 102 (in micrometers) and $R_{total}$ is given in ohms. A line is constructed through (or "fit," typically a least squares fit) to the data points as depicted in FIG. 6 from which one can extract a slope and intercept.

However, the goal is to determine the contact resistivity while the measurements depicted in FIG. 6 provide the total resistance $R_{total}$. The contact resistance is related to the total resistance by Eq. 2.

$$R_{total} = R_{Si} + 2R_{contact} \qquad \text{Eq. 2}$$

in which $R_{Si}$ is the resistance of silicon (or the diffusion resistance). As the gap width approaches zero, $R_{Si}$ vanishes. Thus the y-intercept of FIG. 6 provides $R_{total}$ when $R_{Si}=0$, or $$R_{total}(\text{gap width}=0) = 2R_{contact} \qquad \text{Eq. 3}$$

Figure 7:
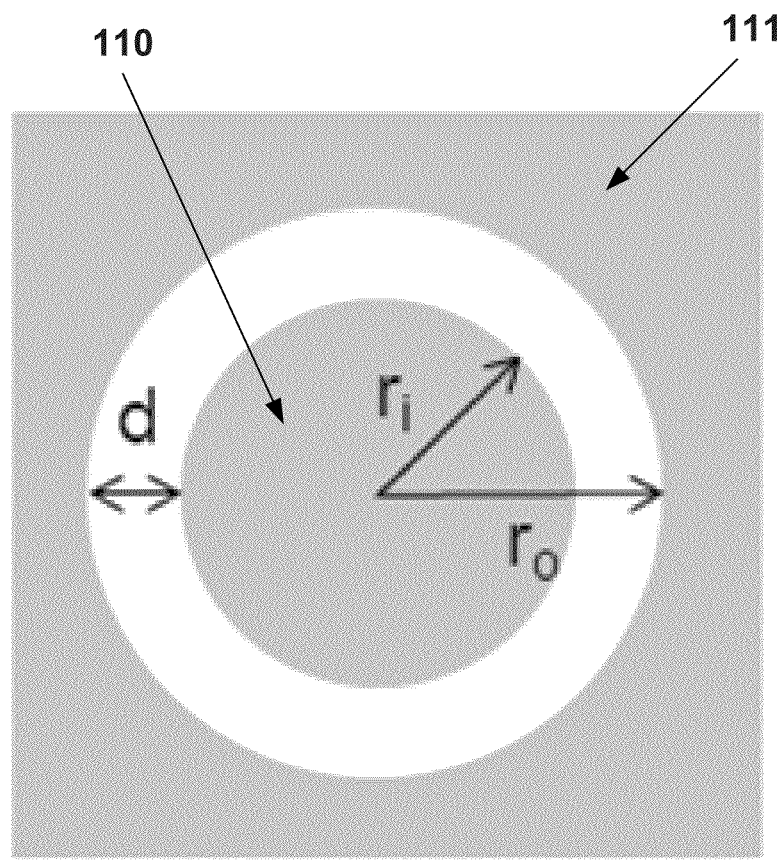
FIG. 7 is a top schematic view of a typical CTLM deposited on a wafer with dimensions identified.

A more precise formula is given in FIG. 17 which refers to FIG. 7. In FIG. 7, 110 and 111 refer to inner and outer conductors respectively, both lying on a substrate in the plane of FIG. 7 and having inner and outer radii $r_i$ and $r_o$ respectively. It is known from basic electromagnetism that current is conducted by a very thin strip in the conductive regions bordering the gap having width d. Denoting this conductive strip by $L_T$, in the typical case of interest here, $L_T$ is very much smaller than either $r_i$ or $r_o$, typically $L_t$ is about 1 μm. As given in FIG. 6, a plot of $R_{total}$ (or $R_T$) as a function of gap width d yields a straight line whose slope is proportional to $R_s$, the semiconductor sheet resistance and whose y-intercept is proportional to $R_c$ the contact resistance.

The transfer length ($L_T$) can be estimated from the x-intercept of a plot of $R_{total}$ gap width a typical example of which it shown in FIG. 6. The specific contact resistivity ($\rho_c$) can then be calculated from Eq. 4 as:

$$\rho_c = R_c * 2\pi r_0 L_T \qquad \text{Eq. 4}$$

Performing these tests in sequence is very tedious and time consuming. Adaptation to parallel, high-throughput processing or high-productivity processing (HPC) brings important time savings, to such an extent that many more combinations of materials and processing conditions can be investigated.

In general, high throughput processing can be performed with a variety of goals in mind from the development of new and improved catalysts, novel chemical compounds with novel or improved properties as well as in a variety of other chemical and materials science applications. The primary interest of the present work relates to the processing of semiconductors in the fabrication of semiconductor electronic devices. To be concrete in the descriptions, described herein are examples from semiconductor device fabrication, not excluding thereby applications of the technology disclosed herein to other fields.

High-productivity combinatorial (HPC) methods relate to simultaneous experimentation on the same substrate (also referred to herein as a "wafer" or "coupon," or "substrate", typically a semiconductor wafer). These simultaneous experiments are performed using different materials and/or different treatments typically holding other controlled conditions constant as the wafer progresses through its typical processing steps. Different locations or spots (e.g. site isolated regions") on the wafer are evaluated under these different sets of conditions to ascertain the results of that particular set of materials and/or processing steps for comparison with the results obtainable with the best known methods.

Typical examples include dry treatments in which material may be etched from the wafer or deposited by physical vapor deposition (PVD) or other techniques. Dry deposition treatments typically involve the deposition of metals, ions or other material onto the wafer through an aperture in a mask with translation of the mask to different locations on the wafer. Simultaneous deposition through multiple apertures in a single mask is also possible but the stepwise deposition is generally more advantageous in present practical applications.

Wet processes (or treatments) are also included within the technology described herein (e.g. as illustrated in FIG. 4). Wet treatments employ wet chemistry experiments in localized regions of the wafer isolated from neighboring regions, typically making use of containers making tight seals with the wafer and containing the process chemicals. Wet processes and dry procedures can be performed at different regions of the same wafer.

Figure 8:
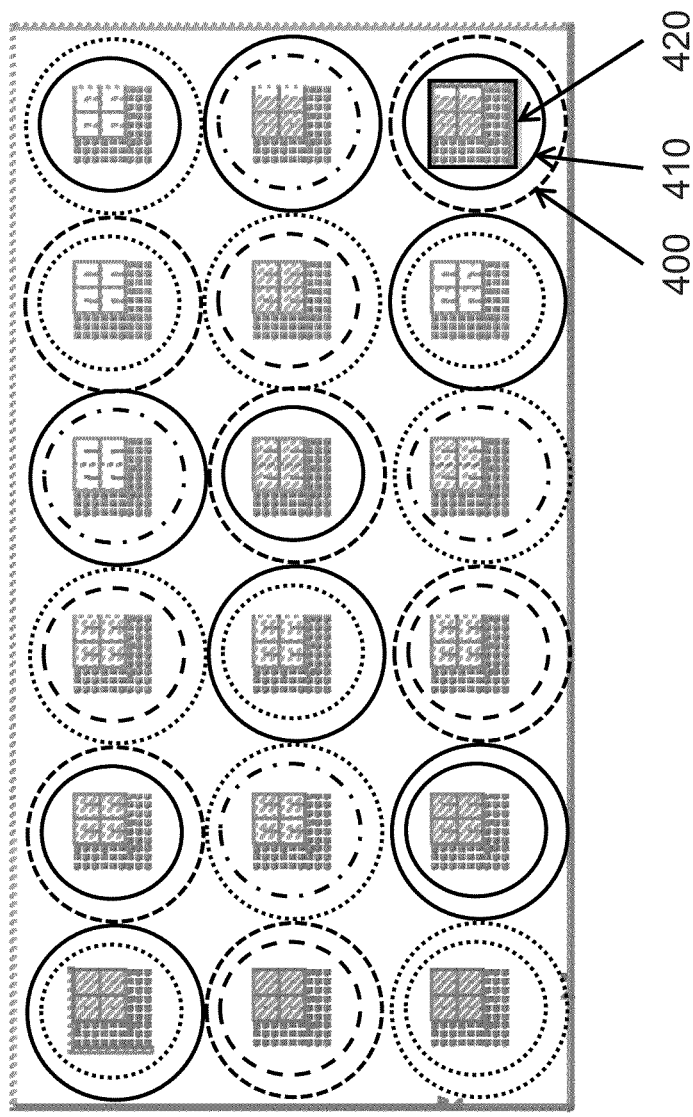
FIG. 8 is a top schematic view of a typical array of CTLM structures deposited on a wafer.

FIG. 8 is a top schematic depiction of a typical CTLM pattern formed at various locations (also referred to as "cells," "dies", "site isolated regions", or "spots") on a wafer (typically via lithography) pursuant to some embodiments of the present invention. To be definite in the description, this particular embodiment is described in detail as a typical example and one expected to have practical applications. The present invention is not limited to such embodiments and other examples will be readily apparent from the descriptions presented herein to those having ordinary skills in the art.

The overall structure of FIG. 8 is typically about 123 mm long by 63 mm wide containing the 18 die structures shown. The circles 400 denote the regions isolated from each other for receiving different physical processing, for example, different PVD processing. These regions are typically about 20 mm diameter. For economy of language, this region of the wafer will be referred to as the "PVD spot." The different line patterns for 400 in FIG. 8 illustrate HPC PVD splits.

The smaller circles 410 indicate the wet processing regions, that is, regions in which different wet chemistry is carried out, isolated from other regions by a tight seal formed between a wet processing chamber and the wafer indicated by 410. One convenient tool for isolating wafer regions in order to perform wet chemistry is the F20™ (F20) of Intermolecular, Inc, For economy of language, the spot(s) isolated for the purpose of performing wet chemistry will be referred to as the "WCh" spot. For the typical case depicted in FIG. 8, the diameter of the WCh spot is about 15 mm. The different line patterns for 410 in FIG. 8 illustrate HPC wet etch splits.

Although FIG. 8 labels a PVD spot and WCh spot surrounding a single CTLM structure, it is understood that multiple CTLM structures, some or all CTLM structures, may be isolated on each wafer. Furthermore, not all CTLM structures in FIG. 8 need to be subject to both wet and dry processing during the course of a test. The PVD spot is typically formed by an aperture in a mask, so it is a simple matter to have the mask pause over only those spots calling for dry processing while skipping the others. On the other hand, wet chemistry processing requires a physical barrier isolating a WCh spot from its neighbors, making a tight seal with the wafer, which needs to be provided for every CTLM location at every processing step. The sites not themselves receiving chemical treatment also need a barrier to prevent exposure to chemistries from neighboring sites.

Figure 9:
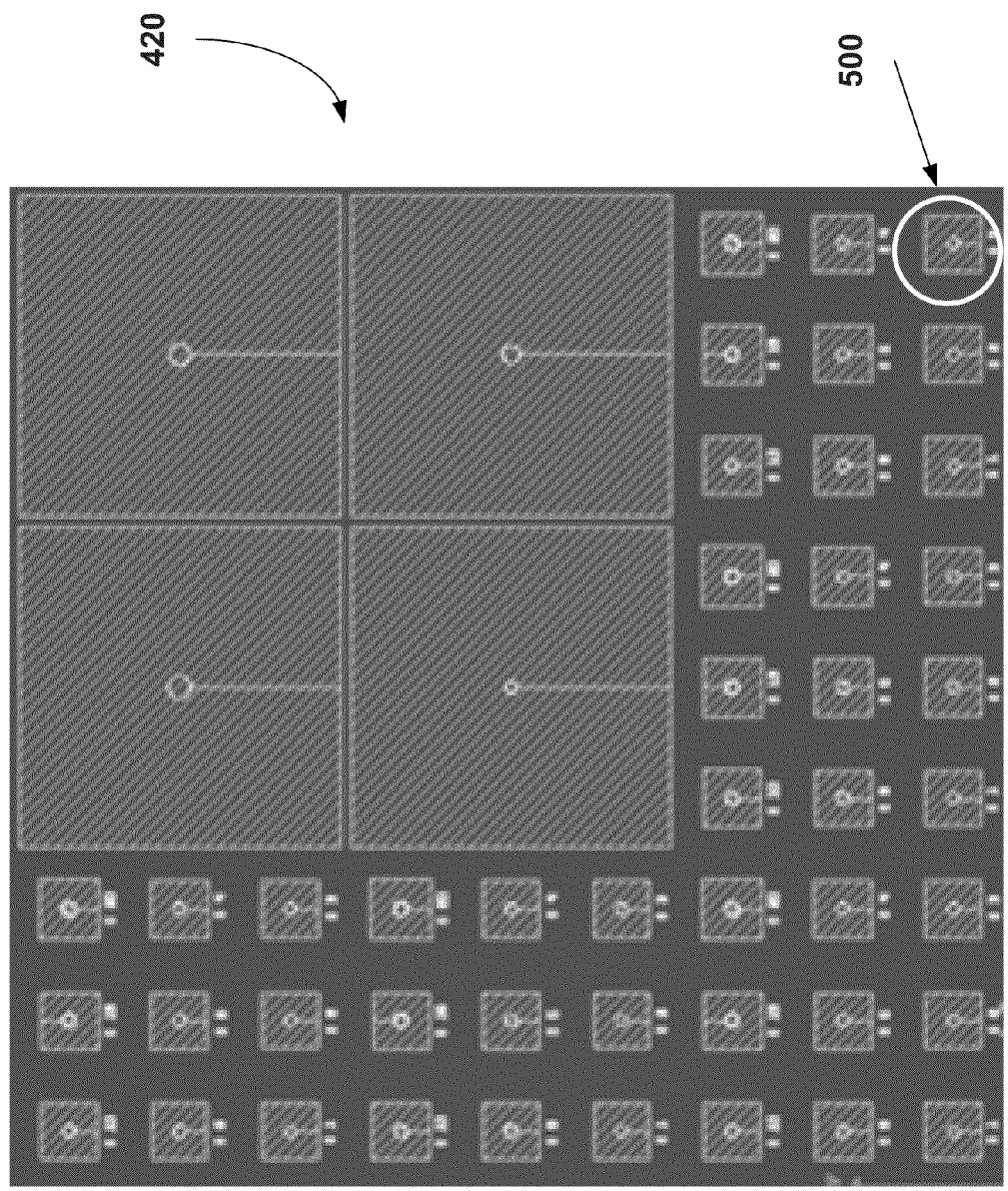
FIG. 9 is an expanded top schematic view of structure 420 from FIG. 8.

An expanded view of the die 420 of FIG. 8 is given in FIG. 9 depicting one example of die 420 containing several small structures, 500. Each of the structures depicted in FIG. 9 is a CTLM structure, typically having various geometries, gap widths, among other variations. These CTLM structures are advantageously formed lithographically. An expanded view of a typical CTLM structure (e.g. 500) is given in FIG. 10.

It is clear that using different wet and dry processing steps for each die on a wafer with different CTLM structures at each die allows a large number of different tests to be carried out in principle. HPC processing technology allows a large number of such tests to be carried out concurrently.

Figure 11:
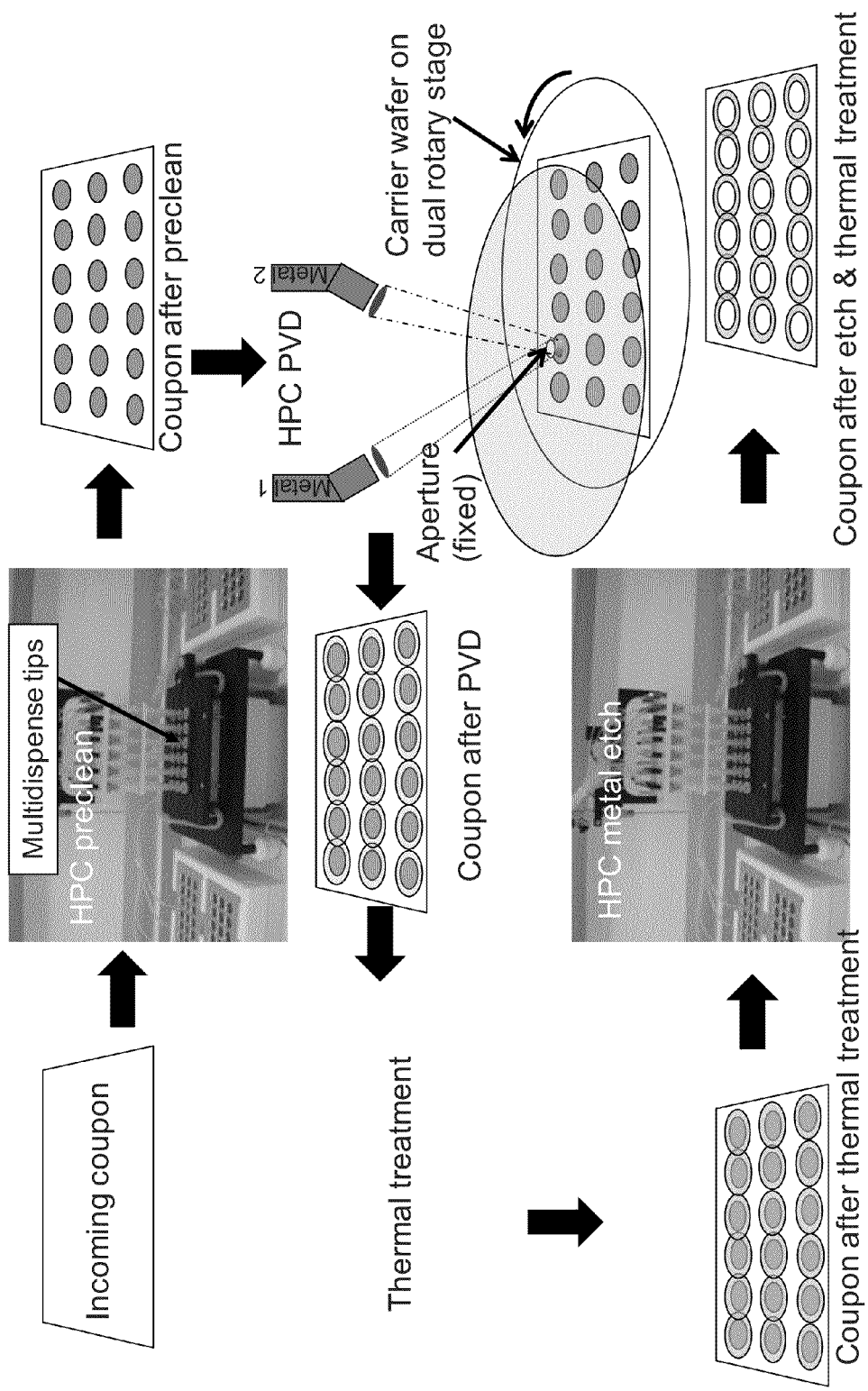
FIG. 11 is a pictorial representation of one possible process flow that can be used to determine contact resistivity.

A possible methodology for determining contact resistivity is given pictorially in FIG. 11. The incoming substrates (coupons) go through HPC wet preclean to expose the semiconductor substrate. With minimal Q-time, the substrate goes through spot-by-spot HPC PVD metal deposition. This deposition could be from a single sputtering target or co-sputtering from multiple targets. This is followed by a thermal treatment to form metal-semiconductor compound(s), such as a silicide. The unreacted metal is removed with HPC wet etch. An optional anneal and fill metal litho/etch (not shown) may also be performed in some applications.

Figure 18:
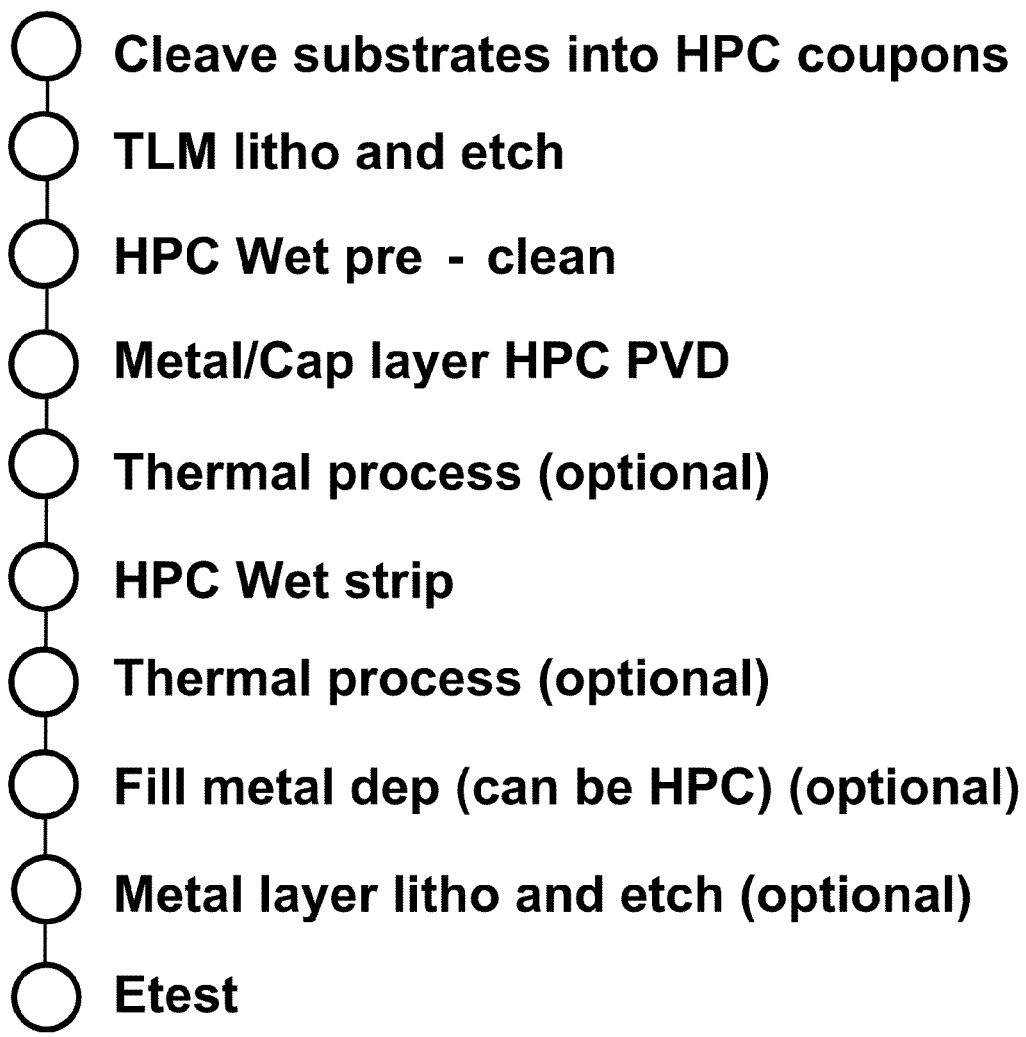
FIG. 18 presents a possible flow for using TLM compatible with HPC processing.

Another example of a sequence of processing steps is given in FIG. 18. Numerous other processes will be apparent to those ordinarily skilled in the art.

Contact Resistivity: Multi-Ring CTLM

One bothersome problem in measuring contact resistivities with CTLM is that of parasitic resistances. Described herein is a multi-ring CTLM, used in conjunction with a single-ring CTLM as generally depicted in FIG. 15 provides a convenient way to compensate for parasitic resistances.

CTLM structures having multiple concentric rings have been disclosed in Deepak supra among other references. However, it is convenient for removing parasitic resistances to employ a multi-ring CTLM in which the distance between the inner and outer pads remains the same from single- to multi-ring CTLMs. Furthermore, the multi-ring and single-ring CTLMs are fabricated so the metalized and non-metalized areas are the same in both devices. In practice, the single-ring resistance is subtracted from the multi-ring resistance to remove the parasitic component, providing the contact resistance from the slope of the resistance plot unlike the procedures described above in which the y-intercept determines contact resistance. The only variable is the resistance due to contact resistances at the edge of each ring, which is expected to increase linearly with the number of rings. Thus, a sequence of experiments with a single-ring CTLM compared to multi-ring (2, 3, 4 . . . ) CTLMs yields contact resistance values without the parasitic component.

A typical embodiment of structures that can be used to perform these measurements is shown in FIG. 15. FIG. 15(B) is a typical CTLM having an inner pad and an outer pad (as identified in FIG. 15(A)). Typically these regions are fabricated of a silicide material formed by the deposition of a metal on a semiconductor substrate followed by annealing. FIG. 15(B) depicts the reference device having a single silicide ring. FIG. 15(A) is a multi-ring CTLM structure in which d denotes the distance between the outer circumference of the inner pad and inner circumference of the outer pad.

Figure 16:
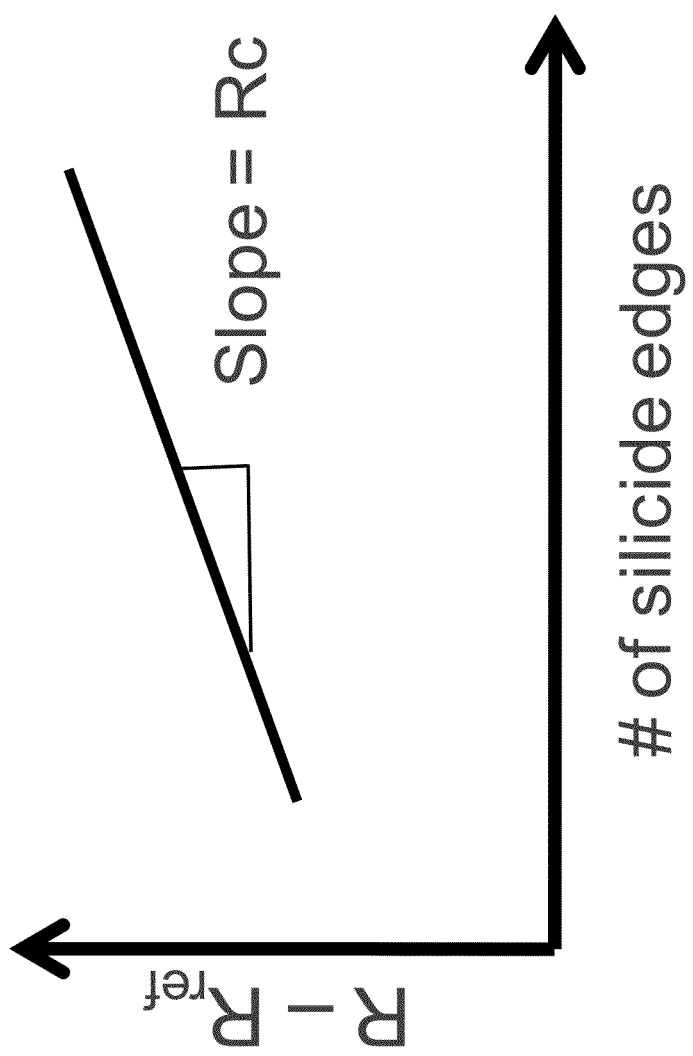
FIG. 16 is a graphical depiction of the derivation of $R_c$ from the slope of the plot in which R is derived from the multi-ring CTLM and $R_{ref}$ is derived from the reference CTLM.

A sequence of resistance measurements is performed for varying numbers of rings between the inner and outer pads. As the number of rings varies, so too does the number of edges between silicided and non-silicided regions. Advantageously, the multi-ring CTLM structures upon which these measurements are performed are subject to certain constraints. (1) The total distance between the inner and outer pads d is held constant throughout the sequence of measurements. (2) The total silicided area and non-silicided area is held constant throughout the sequence of measurements. Subject to these restrictions, the sequence of measurements is performed on several CTLM devices having various numbers of rings (or equivalently, silicide edges). Typical results are given in FIG. 16.

The resistance of multi-ring CTLM is corrected for parasitic component by subtracting the resistance of a single ring device ($R-R_{ref}$). This quantity is plotted against the number of silicide edges. The contact resistance ($R_c$) is determined from the slope of this plot.

The sheet resistance of the semiconductor, $R_s$, needs to be determined by separate measurements. For example, one could use the inline monitoring sites to measure Rs using a 4-probe monitor. Specific contact resistivity $\rho_c$ is then calculated from Eq. 5.

$$\rho_c = (Rc * 2\pi r_o)^2 / R_s \qquad \text{Eq. 5}$$

These structures tend to be self-isolating, facilitating HPC processing without the need for shallow trench isolation or other electrical isolation precautions.

In-Line Test Structure

Conventional HPC processing subjects numerous CTLM structures to the desired sequence of steps, evaluating the performance of the various dies at the end of the process. However, it is usually not possible at the end of the process to find out a reason (or reasons) for the relatively poor performance of some of the dies, or precisely where in the process the performance and/or properties degraded.

Described herein is a convenient way to permit inline (during processing) monitoring of many properties of the dies at various stages in the process, compatible with general HPC processing. Particular examples using HPC PVD technology and HPC wet chemistry are described.

Figure 14:
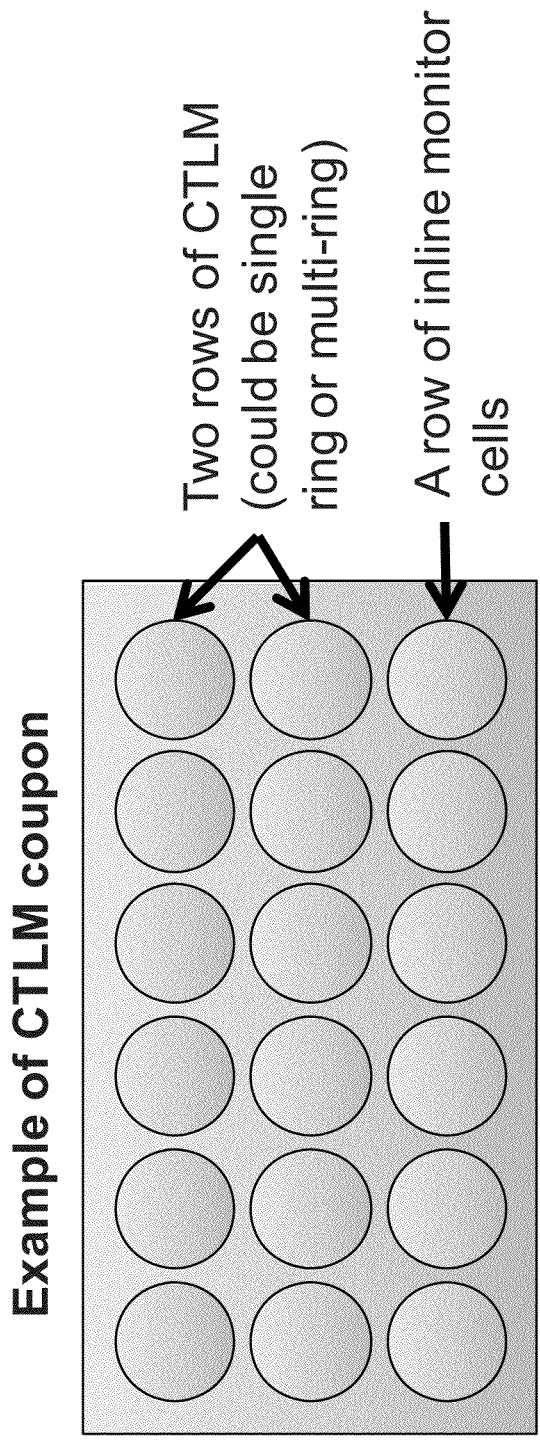
FIG. 14 is a top view schematic depiction of a typical design suitable for inline testing.

A number of "dummy" or "monitor" sites (dies or cells or monitor sites) are produced on the same wafer making use of the masks and technology described herein. Some locations are completely protected during lithography and some other locations are completely exposed, thereby creating different substrate regions such as oxide and silicon. These areas are made large enough such that inline tools can have access to these locations to measure properties such as thickness, sheet resistance, and composition, among others. Examples of typical inline tools include but are not limited to ellipsometer (for film thickness). 4-point probe (for sheet resistance), XRR (X-ray reflectometer for film thickness), XRF (X-ray fluorescence spectrometer for elemental composition) and XRD (X-ray diffractometer for crystal structure), among others. A typical example of this approach is given in FIG. 14, depicting two rows of CTLM structures and one row of monitor cells.

Numerous advantages may arise from the ability to perform this inline testing. For example, properties of the materials used during the process can be monitored inline such as silicide sheet resistance after PVD, after rapid thermal anneal, after wet etch and at the end of the complete process. Also, different materials used in the HPC process can be compared using such inline measurements to help understand differences in electrical properties since the inline test dies encounter the same process equipment at the same times as the electrical test structures. The inline monitors or test structures also provide the ability to monitor the evolution of material properties as the wafers progress along the process flow, such as monitoring the etch rates of films by comparing initial and final film thickness divided by etch time. The inline monitors also go through the same HPC PVD and HPC wet etch conditions as the rest of the wafer.

The ability to perform inline monitoring greatly assists in debugging and optimizing the processes, typically accomplishing these goals much faster than is possible with other techniques. For example, knowledge of the in-process properties of materials, correlated with the electrical performance of the completed device, can greatly reduce the time needed for optimization of a given process or process module.

Schottky Barrier

A Schottky barrier is an electrical potential barrier formed at the interface between a metal and semiconductor having properties of a rectifier and can be used as a diode. The Schottky barrier is the difference between the work function of the metal and the conduction band (for n-type) or valence band (for p-type) edges of the semiconductor. The height of the Schottky barrier can be an important parameter in determining the performance of some semiconductor devices. The ability to use different metals and different geometries in CTLM structures on a semiconductor wafer allows the determination of Schottky barrier heights in a manner compatible with HPC processing.

The CTLM structures employed for Schottky barrier determination are very similar to that employed for contact resistivity determination as described above and depicted in FIGS. 8, 9 and 10. However, the determination of Schottky barrier heights is typically performed on wafers having lower doping levels than is typically employed for contact resistivity determinations since high doping levels are prone to the formation of ohmic contacts rather than Schottky barriers.

The contact resistivity measurements described above force the current to be a desired value and then measure the resulting voltage. In contrast. Schottky barrier determination applies a constant voltage to the CTLM electrodes and measures the current which is then repeated for a series of applied constant voltages.

Figure 10:
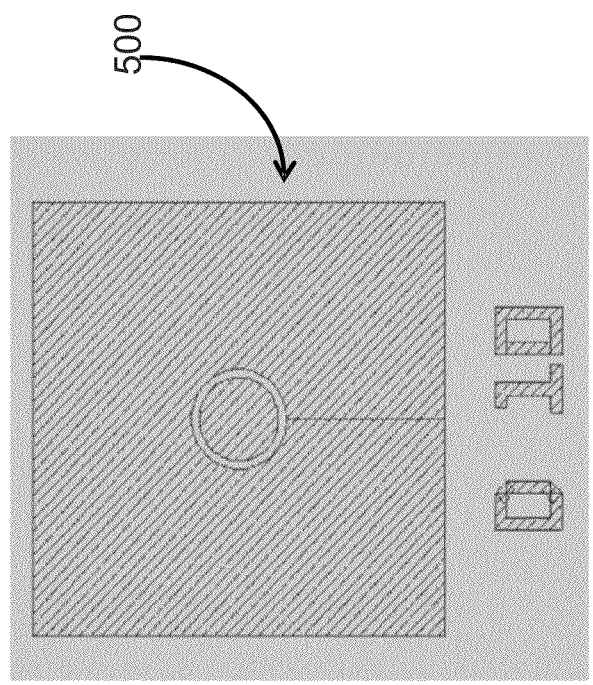
FIG. 10 is an expanded top schematic view of structure 500 from FIG. 9.
Figure 12:
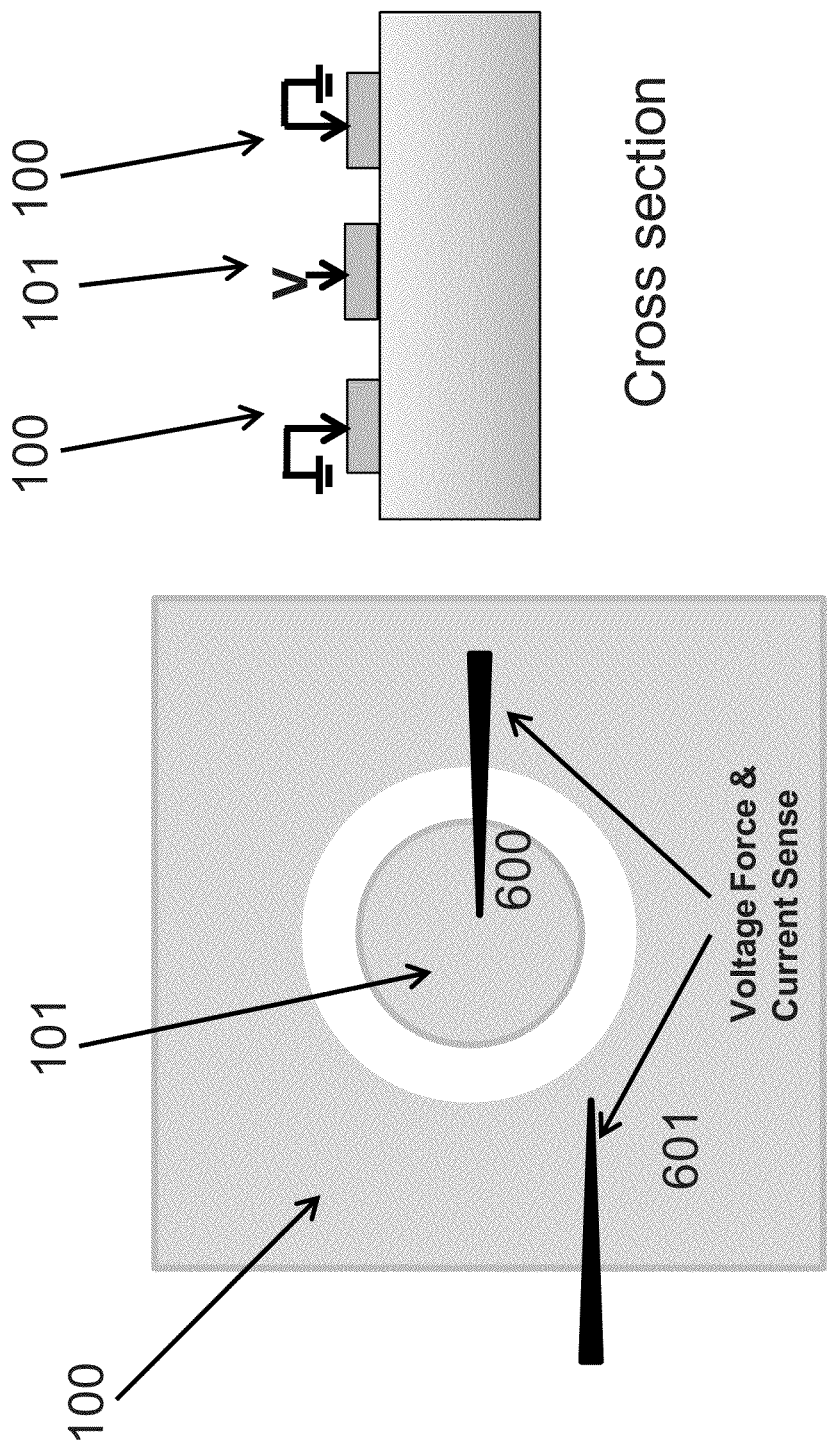
FIG. 12 is a depiction of Schottky Barrier measurement scheme in top view and cross section.

FIG. 12 is a depiction of Schottky Barrier measurement scheme in top view and cross section employing the structures depicted in FIGS. 8, 9 and 10 and described above in connection with contact resistivity determination.

Figure 13:
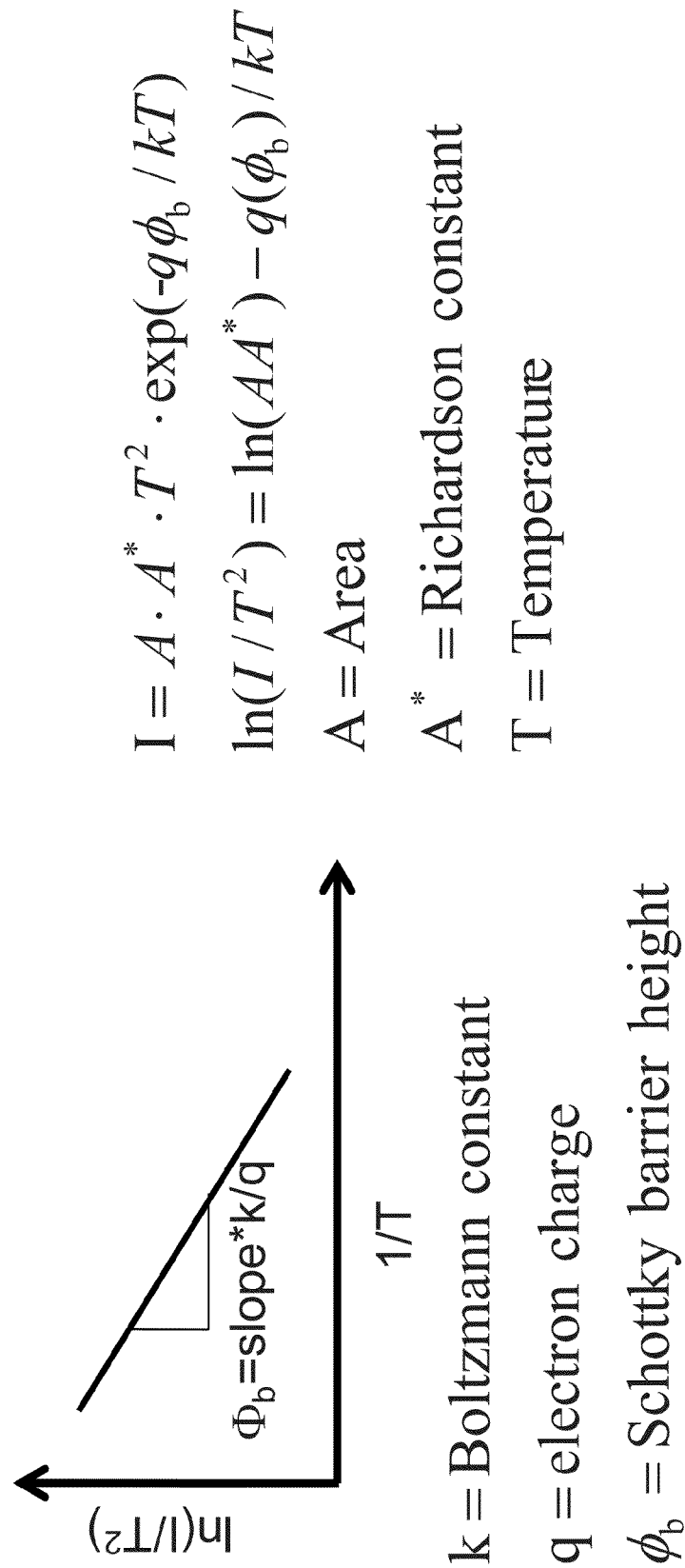
FIG. 13 is a graphical depiction of $\ln[I/T^2]$ vs $1/T$ from which Schottky barrier height can be determined.

However, different procedures are employed. Two probes 600, 601 are used to force voltage and measure current. The outer electrode is grounded. For a typical measurement, the die is held at a constant temperature T, typically in the range from about 25 deg. C. to about 90 deg. C. At this fixed temperature, current (in amperes) is measured for a sequence of voltages using reverse bias on the inner electrode. The test is repeated for at least 3-4 different temperatures. Reverse leakage current at a fixed voltage such as 1V is used and the slope of the curve $\ln(I/T^2)$ vs $(1/T)$ provides the Schottky barrier height as given in FIG. 13.

As a result of integrating HPC with a Schottky structure (that is CTLM on a wafer under conditions forming a Schottky barrier), one can use Schottky diode leakage current as a function of temperature to obtain barrier height between different metals (or metallic compounds) and the semiconductor wafer. Thus, the combination of a Schottky structure with an HPC process retains substantially all the advantages of the HPC methodology.

The combination of a Schottky structure on a wafer with wet etch treatments (such as those utilizing HPC wet chemistry), allows one to correlate Schottky barrier height with wet etch treatments. The wet etch can arise as a preclean before metal deposition or as a metal etch during the process flow.

Also, the Schottky structure in combination with metal PVD HPC dry processing can be used to improve or optimize film thickness or materials in a multi-layer stack. For example, a metal forming a silicide and a cap layer atop can be screened separately using HPC and used for correlating barrier height with process conditions.

The structures shown herein for performing Schottky barrier determination are thus compatible with HPC procedures thus permitting much more rapid data collection. In common with other CTLM structures described herein, the Schottky barrier structure tends to be self-isolating, eliminating the need for special isolation procedures such as shallow trench isolation, simplifying process flow.

Although various embodiments which incorporate the teachings of the present invention have been shown and described in detail herein, those skilled in the art can readily devise many other varied embodiments that still incorporate these teachings.

What is claimed is:

1. A method of determining a contact resistance of a conductor deposited on a substrate during combinatorial processing, wherein the substrate comprises a semiconductor, the method comprising:
   a) providing the substrate, wherein the substrate comprises a plurality of site isolated regions;
   b) providing a Circular Transmission Line Method (CTLM) structure on at least one site isolated region, wherein the CTLM structure comprises:
      i) an inner conducting region surrounded by an outer conducting region, wherein the outer conducting region is separated from the inner conducting region by an annular gap; and,
      ii) a first voltage sensing electrode in electrical contact with the inner conducting region and a second voltage sensing electrode in electrical contact with the outer conducting region; and,
      iii) a first current forcing electrode in electrical contact with the inner conducting region and a second current forcing electrode in electrical contact with the outer conducting region;
   c) applying a constant current between the inner conducting region and the outer conducting region through the first current forcing electrode and the second current forcing electrode;
   d) measuring a voltage difference between the inner conducting region and the outer conducting region for each of a plurality of values of constant current, and determining a total resistance from the slope of the line; and,
   e) repeating steps b)-d), for each of a plurality of sizes of the annular gap, and determining therefrom the contact resistance.

2. A method as in claim 1, further comprising performing steps b)-e) concurrently at a plurality of site isolated regions on the substrate wherein a process is varied between the plurality of site isolated regions in a combinatorial manner.

3. A method as in claim 2 wherein the process is one of HPC PVD process or HPC wet process.

4. A method as in claim 1 wherein one or more of the second voltage sensing electrodes is electrically grounded.

5. A method as in claim 1 wherein step e) is performed concurrently for a plurality of CTLM structures, substantially identical except for different sizes of annular gap.

6. A method of eliminating parasitic resistance in the measurement of contact resistance of a conductor deposited on a substrate during combinatorial processing, wherein the substrate comprises a semiconductor, the method comprising:
   a) providing the substrate, wherein the substrate comprises a plurality of site isolated regions;
   b) providing a first and a second Circular Transmission Line Method (CTLM) structure on at least one site isolated region of the semiconducting wafer;
      i) wherein the first CTLM structure comprises a first inner conducting region surrounded by a first outer conducting region;
      ii) wherein the first outer conducting region is separated from the first inner conducting region by an annular gap;
      iii) wherein the second CTLM structure comprises a second inner conducting region surrounded by a second outer conducting region, and wherein the second inner conducting region is separated from the second outer conducting region by an annular gap, and wherein one or more intermediate conducting regions having substantially annular shape are located in the annular region separating the second inner conducting region from the second outer conducting region; and,
      iv) wherein the separation between the first inner conducting region and the first outer conducting region is substantially the same as the separation between the second inner conducting region and the second outer conducting region; and,
      v) wherein the total area of conducting region is substantially the same in the first CTLM structure and the second CTLM structure;
   c) determining a difference in resistance between the first CTLM structure and the second CTLM structure;
   d) repeating steps b) and c) employing second CTLM structures having different numbers of intermediate conducting regions; and
   e) determining a contact resistance in which the parasitic component is eliminated using the differences in resistance determined in step d).

7. A method as in claim 6 further comprising
   performing steps b)-d) concurrently at a plurality of site isolated regions on the substrate wherein a process is varied between the plurality of site isolated regions in a combinatorial manner.

8. A method as in claim 7 wherein the process is one of HPC PVD process or HPC wet process.

9. A method of determining a Schottky barrier height of a conductor deposited on a substrate during combinatorial processing, wherein the substrate comprises a semiconductor, the method comprising:
   a) providing the substrate, wherein the substrate comprises a plurality of site isolated regions;

b) providing a Circular Transmission Line Method (CTLM) structure on the one or more site isolated regions of the substrate wherein the CTLM structure comprises:
  i) an inner conducting region surrounded by an outer conducting region, wherein the outer conducting region is separated from the inner conducting region by an annular gap;
  ii) a first voltage electrode in electrical contact with the inner conducting region and a second voltage electrode in electrical contact with the outer conducting region;
  iii) a first current electrode in electrical contact with the inner conducting region and a second current electrode in electrical contact with the outer conducting region;
c) applying a constant voltage between the inner conducting region and the outer conducting region under conditions of reverse bias;
d) measuring the current flow I between the inner conducting region and the outer conducting region for a plurality of values of the applied voltage;
e) repeating step d at a plurality of temperatures T; and
f) determining the Schottky barrier height.

10. A method as in claim 9 wherein further comprising performing steps (b)-(f) concurrently on the plurality of site isolated on the substrate wherein a process is varied between the plurality of site isolated regions in a combinatorial manner.

11. A method as in claim 10 wherein the process is one of HPC PVD process or HPC wet process.

12. A method as in claim 9 wherein the second voltage electrode in electrical contact with the outer conducting region is grounded.

* * * * *